(12) United States Patent
Li et al.

(10) Patent No.: US 9,341,905 B1
(45) Date of Patent: May 17, 2016

(54) ARRAY SUBSTRATE, LIQUID CRYSTAL DISPLAY PANEL AND LIQUID CRYSTAL DISPLAY

(71) Applicant: Shenzhen China Star Optoelectronics Technology Co., Ltd., Shenzhen, Guangdong (CN)

(72) Inventors: Qianqian Li, Guangdong (CN); Je-hao Hsu, Guangdong (CN); Caiqin Chen, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 14/420,372

(22) PCT Filed: Nov. 12, 2014

(86) PCT No.: PCT/CN2014/090950
§ 371 (c)(1),
(2) Date: Feb. 8, 2015

(51) Int. Cl.
*G09G 3/36* (2006.01)
*G02F 1/1362* (2006.01)
*G02F 1/1368* (2006.01)
*G02F 1/1335* (2006.01)
*G02F 1/1343* (2006.01)
*H01L 27/12* (2006.01)

(52) U.S. Cl.
CPC ........ *G02F 1/136286* (2013.01); *G02F 1/1368* (2013.01); *G02F 1/133514* (2013.01); *G02F 1/134336* (2013.01); *H01L 27/124* (2013.01); *G02F 2001/134345* (2013.01)

(58) Field of Classification Search
CPC .................................................. G09G 3/3614
See application file for complete search history.

(56) References Cited

U.S. PATENT DOCUMENTS

| | | | | |
|---|---|---|---|---|
| 8,773,419 B2* | 7/2014 | Nam | .................... | G09G 3/3648 345/204 |
| 9,024,850 B2* | 5/2015 | Lee | .................... | G02F 1/136286 345/104 |
| 9,129,570 B2* | 9/2015 | Cho | .................... | G09G 3/3607 |
| 9,183,809 B2* | 11/2015 | Jeong | .................... | G09G 5/001 |
| 9,224,348 B2* | 12/2015 | Kim | .................... | G09G 3/3614 |
| 2014/0125647 A1* | 5/2014 | Shin | .................... | G09G 3/3648 345/212 |
| 2015/0015623 A1* | 1/2015 | Yang | .................... | G09G 3/3648 345/697 |
| 2015/0061983 A1* | 3/2015 | Kim | .................... | G09G 3/3233 345/82 |

* cited by examiner

*Primary Examiner* — Timothy L Rude
(74) *Attorney, Agent, or Firm* — Andrew C. Cheng

(57) ABSTRACT

The present invention discloses an array substrate, which includes a sub-pixel array, a number of data lines, and a number of scanning lines. The sub-pixel array is divided into a number of column groups along the distribution direction of the data lines, and is divided into a number of row groups along the distribution direction of the scanning lines. By designing the layout of the sub-pixels, the data lines and the scanning lines in the array substrate, there are alternately distributed sufficiently charged sub-pixels and insufficiently charged sub-pixels exist in a same column of sub-pixels when a dot inversion driving is used. Therefore, a LCD panel including the array substrate has even brightness uniformity, and the defect of vertical bright-dark lines is alleviated. The present invention also discloses a LCD panel including the above array substrate and a corresponding LCD.

15 Claims, 6 Drawing Sheets

ARRAY SUBSTRATE, LIQUID CRYSTAL DISPLAY PANEL AND LIQUID CRYSTAL DISPLAY

TECHNICAL FIELD

The present invention relates to liquid crystal display technology, and more particularly to an array substrate, a liquid crystal display panel and a liquid crystal display.

BACKGROUND

A liquid crystal display (LCD) is a thin flat display device and a LCD panel is an important part of the liquid crystal display. The LCD panel at least includes an array substrate and a color filter substrate disposed opposite to each other, and a liquid crystal layer disposed between the array substrate and the color filter substrate. A pixel array, data lines and scanning lines crossed with each other are disposed in the array substrate. The data lines provide data signals to the pixel array, and the scanning lines provide scanning signals to sub-pixels. In a conventional array substrate, pixels in a same column are connected to a same data line, and the same data line provides data signals for all the pixels in the column. Pixels in a same row are connected to a same scanning line, and the same scanning line provides scanning signals for all the pixels in the row. In an array substrate, there are many other layout designs of data lines and scanning lines, and one of the layout designs can reduce the number of data lines in half and this layout is called a data line share configuration.

FIG. 1 is a schematic view illustrating a part of an array substrate has the conventional data line share configuration. In the array substrate, there are a pixel array, which includes sub-pixels P11, P12, P13, P22, and P23, data lines D1~D5, and scanning lines G1~G6 crossed with the data lines D1~D5. Two horizontally adjacent sub-pixels in the pixel array share a common data line (for example, the sub-pixels P12 and P13 share the data line D2, and the sub-pixels P22 and P23 share the data line D2). According to this configuration, the number data lines can be reduced in half in comparison to the conventional pixel driving array of LCD. Adjacent sub-pixels in a same row are connected to different scanning lines (for example, the sub-pixels P12 and P13 are connected to scanning lines G1 and G2, respectively), every two sub-pixels, which has one sub-pixel disposed therebetween, are connected to a same scanning line (for example, the sub-pixels P11 and P13 are connected to the scanning line G2), vertically adjacent sub-pixels are connected to different scanning lines (for example, the sub-pixels P12 and P22 are connected to scanning lines G2 and G3, respectively). According to this configuration, the number of scanning lines is doubled in comparison to the conventional pixel driving array.

Since the doubled number of scanning lines reduced the scan time allocated to each scanning line, the charging time of sub-pixels is also reduced. Currently, the LCD is usually driven using a dot inversion manner. That is, adjacent two data lines have opposite signal polarity, a same data line has opposite signal polarity at adjacent rows. As the data lines has a certain impedance, delay distortion will occur during the transmission of data signals, and this causes the difference of pixel charging rate between two adjacent columns of data lines. As shown in wave shape of driving signals of FIG. 2, D (odd) is the wave shape of data lines of odd numbers while D (even) is the wave shape of data lines of even numbers. D (odd) and D (even) have opposite signal polarity. In FIG. 2, the dashed wave shape is the theoretical wave shape, and the solid wave shape is the actual wave shape having delay distortion. Referring to FIG. 1, taking the wave shape D (even) at the data line D2 as an example, when the scanning lines G1~G4 are switched on sequentially, the data line D2 charges the sub-pixels P12, P13, P22 and P23 in the same sequence. The data line D2 charges two sub-pixels P12, P13 and the two sub-pixels P22, P23 in a same signal polarity cycle, respectively. In a same signal polarity cycle, insufficient charging exists in the sub-pixels P12 and P22 that are firstly charged due to the signal distortion and the sub-pixels P12 and P22 have lower brightness. The sub-pixels P13 and P23 that are finally charged have higher charging rate and have higher brightness. Taking a look at the entire column, a bright-dark line is produced. Similarly, a plurality of spaced bright-dark lines along the vertical direction will be produced in the entire LCD panel, and the display quality is reduced.

Based on the above, it is desired to provide a solution to overcome the defect of bright-dark lines in liquid crystal display panels.

SUMMARY

To overcome the shortcomings of the prior techniques, embodiments of the present invention provides an array substrate. By designing the layout of the sub-pixels, the data lines and the scanning lines in the array substrate, the defect of vertical bright-dark lines in LCD panel including the array substrate is alleviated.

To achieve the above object, embodiments of the present invention are provided as follows.

An array substrate includes a sub-pixel array, a plurality of data lines and a plurality of scanning lines.

A column group is formed between every two adjacent data lines. Each column group includes two columns of sub-pixels. Sub-pixels in column groups numbered with odd numbers are connected to a closer one of the two adjacent data lines disposed at opposite sides of a corresponding column group. Sub-pixels in column groups numbered with even numbers and in rows numbered with odd numbers are connected to a closer one of the two adjacent data lines. Sub-pixels in column groups numbered with even numbers and in rows numbered with even numbers are connected to a farther one of the two adjacent data lines.

Two scanning lines are disposed at top and bottom of each row of sub-pixels and the two scanning lines are configured only for driving a same corresponding row of sub-pixels. The plurality of scanning lines divide the sub-pixel array into a plurality of row groups and each row group includes one or two rows of sub-pixels. In the row groups numbered n and n+6, each row of sub-pixels in a column group numbered with an even number is connected to a scanning line disposed on a top of a corresponding row of sub-pixels, each row of sub-pixels in a column group numbered with an odd number is connected to a scanning line disposed on a bottom of a corresponding row of sub-pixels. In the row groups numbered n+1 and n+5, each sub-pixel numbered with i and i+1 in each row of the row groups is connected to a scanning line disposed on a top of a corresponding row of sub-pixels, and each sub-pixel numbered with j and j+3 in each row of the row groups is connected to a scanning line disposed on a bottom of a corresponding row of sub-pixels. In the row groups numbered n+2 and n+4, each row of sub-pixels in a column group numbered with an odd number is connected to a scanning line disposed on a top of a corresponding row of sub-pixels, each row of sub-pixels in a column group numbered with an even number is connected to a scanning line disposed on a bottom of a corresponding row of sub-pixels. In the row groups numbered n+3, each sub-pixel numbered with j and j+3 in each row of the row groups is connected to a scanning line disposed on a top of a corresponding row of sub-pixels, and each sub-pixel numbered with i and i+1 in each row of the row groups is connected to a scanning line disposed on a bottom of a corresponding row of sub-pixels. n=1, 5, 9, . . . n−4, n; i=2, 6, 10, . . . i−4, i; j=1, 5, 9, . . . j−4, j According to another aspect, each sub-pixel is connected to a corresponding data line and a corresponding scanning line via a switching element.

According to another aspect, the switching element is a thin film transistor, a gate electrode of the thin film transistor is electrically connected to the corresponding scanning line, a source electrode of the thin film transistor is electrically connected to the corresponding data line, and a drain electrode of the thin film transistor is electrically connected to the sub-pixel.

According to another aspect, a liquid crystal display panel is provided. The liquid crystal display panel includes a display unit. The display unit includes an array substrate, a color filter substrate disposed opposite to the array substrate, and a liquid layer interposed between the array substrate and the color filter substrate.

The array substrate includes a sub-pixel array, a plurality of data lines and a plurality of scanning lines.

A column group is formed between every two adjacent data lines. Each column group includes two columns of sub-pixels. Sub-pixels in column groups numbered with odd numbers are connected to a closer one of the two adjacent data lines disposed at opposite sides of a corresponding column group. Sub-pixels in column groups numbered with even numbers and in rows numbered with odd numbers are connected to a closer one of the two adjacent data lines. Sub-pixels in column groups numbered with even numbers and in rows numbered with even numbers are connected to a farther one of the two adjacent data lines.

Two scanning lines are disposed at top and bottom of each row of sub-pixels and the two scanning lines are configured only for driving a same corresponding row of sub-pixels. The plurality of scanning lines divide the sub-pixel array into a plurality of row groups and each row group includes one or two rows of sub-pixels. In the row groups numbered n and n+6, each row of sub-pixels in a column group numbered with an even number is connected to a scanning line disposed on a top of a corresponding row of sub-pixels, each row of sub-pixels in a column group numbered with an odd number is connected to a scanning line disposed on a bottom of a corresponding row of sub-pixels. In the row groups numbered n+1 and n+5, each sub-pixel numbered with i and i+1 in each row of the row groups is connected to a scanning line disposed on a top of a corresponding row of sub-pixels, and each sub-pixel numbered with j and j+3 in each row of the row groups is connected to a scanning line disposed on a bottom of a corresponding row of sub-pixels. In the row groups numbered n+2 and n+4, each row of sub-pixels in a column group numbered with an odd number is connected to a scanning line disposed on a top of a corresponding row of sub-pixels, each row of sub-pixels in a column group numbered with an even number is connected to a scanning line disposed on a bottom of a corresponding row of sub-pixels. In the row groups numbered n+3, each sub-pixel numbered with j and j+3 in each row of the row groups is connected to a scanning line disposed on a top of a corresponding row of sub-pixels, and each sub-pixel numbered with i and i+1 in each row of the row groups is connected to a scanning line disposed on a bottom of a corresponding row of sub-pixels. n=1, 5, 9, . . . n−4, n; i=2, 6, 10, . . . i−4, i; j=1, 5, 9, . . . j−4, j According to another aspect, each sub-pixel is connected to a corresponding data line and a corresponding scanning line via a switching element.

According to another aspect, the switching element is a thin film transistor, a gate electrode of the thin film transistor is electrically connected to the corresponding scanning line, a source electrode of the thin film transistor is electrically connected to the corresponding data line, and a drain electrode of the thin film transistor is electrically connected to the sub-pixel.

According to another aspect, the liquid crystal display panel further includes a gate driver and a source driver, the gate driver provides scanning signals to the sub-pixel array via the scanning lines, and the source driver provides data signals to the sub-pixel array via the data lines.

According to another aspect, the sub-pixels include red sub-pixels, green sub-pixels and blue sub-pixels.

According to another aspect, the liquid crystal display panel is driven using a dot inversion manner.

According to another aspect, a liquid crystal display is provided. The liquid crystal display includes a liquid crystal display panel and a backlight module, the liquid crystal display panel and the backlight module are disposed opposite to each other, the backlight module provides light source to the liquid crystal display panel for enabling the liquid crystal display panel to display images. The liquid crystal display panel is the liquid crystal display panel described above.

Compared to the prior art, the array substrate provided by embodiments has an improved layout design. By designing the layout of the sub-pixels, the data lines and the scanning lines in the array substrate, there are alternately distributed sufficiently charged sub-pixels and insufficiently charged sub-pixels exist in a same column of sub-pixels when a dot inversion driving is used (here, the sufficiently charged sub-pixels and insufficiently charged sub-pixels are defined relatively). Therefore, a LCD panel including the array substrate has even brightness uniformity, and the defect of vertical bright-dark lines is alleviated.

DETAILED DESCRIPTION OF PREFERRED EMBODIMENTS

Figure 1:
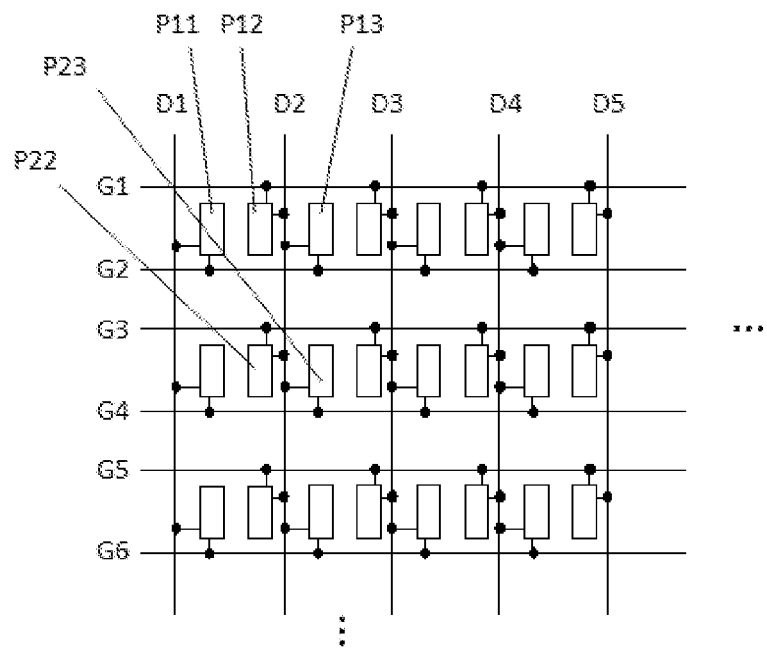
FIG. 1 is a schematic view illustrating a part of an array substrate has the conventional data line share configuration.
Figure 2:
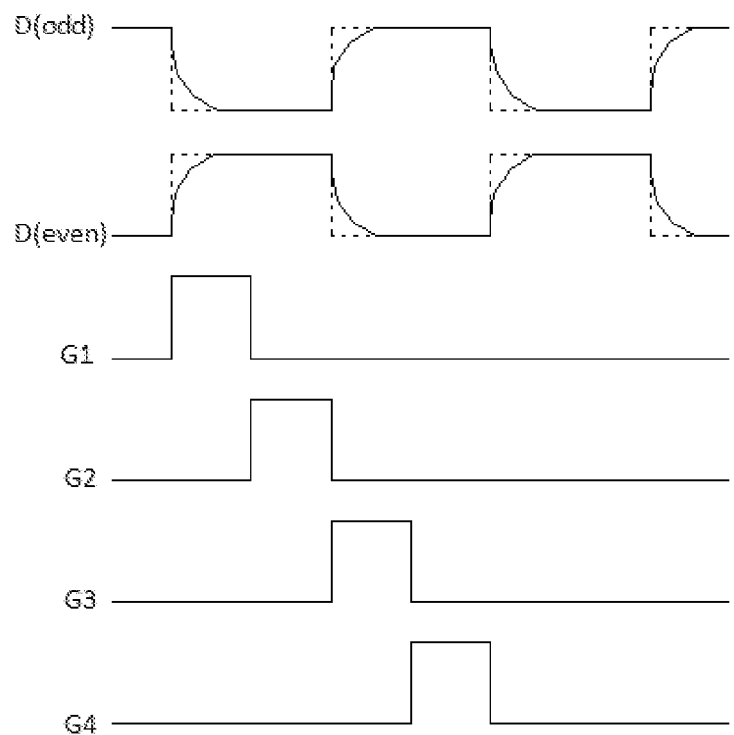
FIG. 2 is a wave shape diagram illustrating the dot inversion driving.

As described above, an object of the present invention is to alleviate the defect that vertical bright-dark lines exist in LCD panel of data line share configuration. An array substrate is provided. The array substrate includes a sub-pixels array, a plurality of data lines and a plurality of scanning lines. The data lines are crossed with the scanning lines with each other. By designing the layout of the sub-pixels, the data lines and the scanning lines in the array substrate, there are alternately distributed sufficiently charged sub-pixels and insufficiently charged sub-pixels exist in a same column of sub-pixels when a dot inversion driving is used.

For the connection of the sub-pixels and the data lines, a column group is disposed between every two adjacent data lines in the plurality of data lines; each column group includes two columns of sub-pixels.

From the left end to the right end, the data lines are numbered with continuous natural numbers. For sub-pixels in a column group numbered with odd numbers, each of the sub-pixels is connected to a closer one of the two data lines disposed at opposite sides of the column group. For sub-pixels in a column group numbered with even numbers, each of the sub-pixels is connected to a farther one of the two data lines disposed at opposite of the column group. Here, the closer one or farther one is defined relatively to another one.

For the connection of the sub-pixels and the scanning lines, first, two scanning lines are disposed at top and bottom sides of each row of sub-pixels, and these two scanning lines are only used to drive a same row of sub-pixels. Then, the sub-pixel array is also divided into a plurality of row groups, and each of the row groups includes one or two rows of sub-pixels.

Specifically, from the top end to the bottom end, the row groups are numbered with continuous natural numbers.

In the row groups numbered n and n+6, each row of sub-pixels in a column group numbered with an even number is connected to a scanning line disposed on a top of the row of a corresponding row of sub-pixels, each row of sub-pixels in a column group numbered with an odd number is connected to a scanning line disposed on a bottom of a corresponding row of sub-pixels.

In the row groups numbered n+1 and n+5, each sub-pixel numbered with i and i+1 in each row of the row groups is connected to a scanning line disposed on a top of a corresponding row of sub-pixels, and each sub-pixel numbered with j and j+3 in each row of the row groups is connected to a scanning line disposed on a bottom of a corresponding row of sub-pixels.

In the row groups numbered n+2 and n+4, each row of sub-pixels in a column group numbered with an odd number is connected to a scanning line disposed on a top of a corresponding row of sub-pixels, each row of sub-pixels in a column group numbered with an even number is connected to a scanning line disposed on a bottom of a corresponding row of sub-pixels.

In the row groups numbered n+3, each sub-pixel numbered with j and j+3 in each row of the row groups being connected to a scanning line disposed on a top of a corresponding row of sub-pixels, and each sub-pixel numbered with i and i+1 in each row of the row groups being connected to a scanning line disposed on a bottom of a corresponding row of sub-pixels.

n=1, 5, 9, . . . n−4, n; i=2, 6, 10, . . . i−4, i; j=1, 5, 9, . . . j−4, j

In the above connection manner of the sub-pixels and the scanning lines, when a row group includes two rows of sub-pixels, the connection of one row of sub-pixels in the row group to the data lines and scanning lines is completely same to that of another row of sub-pixels. That is, the two rows of sub-pixels are used as repeating units.

To make the object, technical solutions and advantages of the present invention more clearly, embodiments of the present invention will be described in detail accompanying with figures.

Embodiment 1

Figure 3:
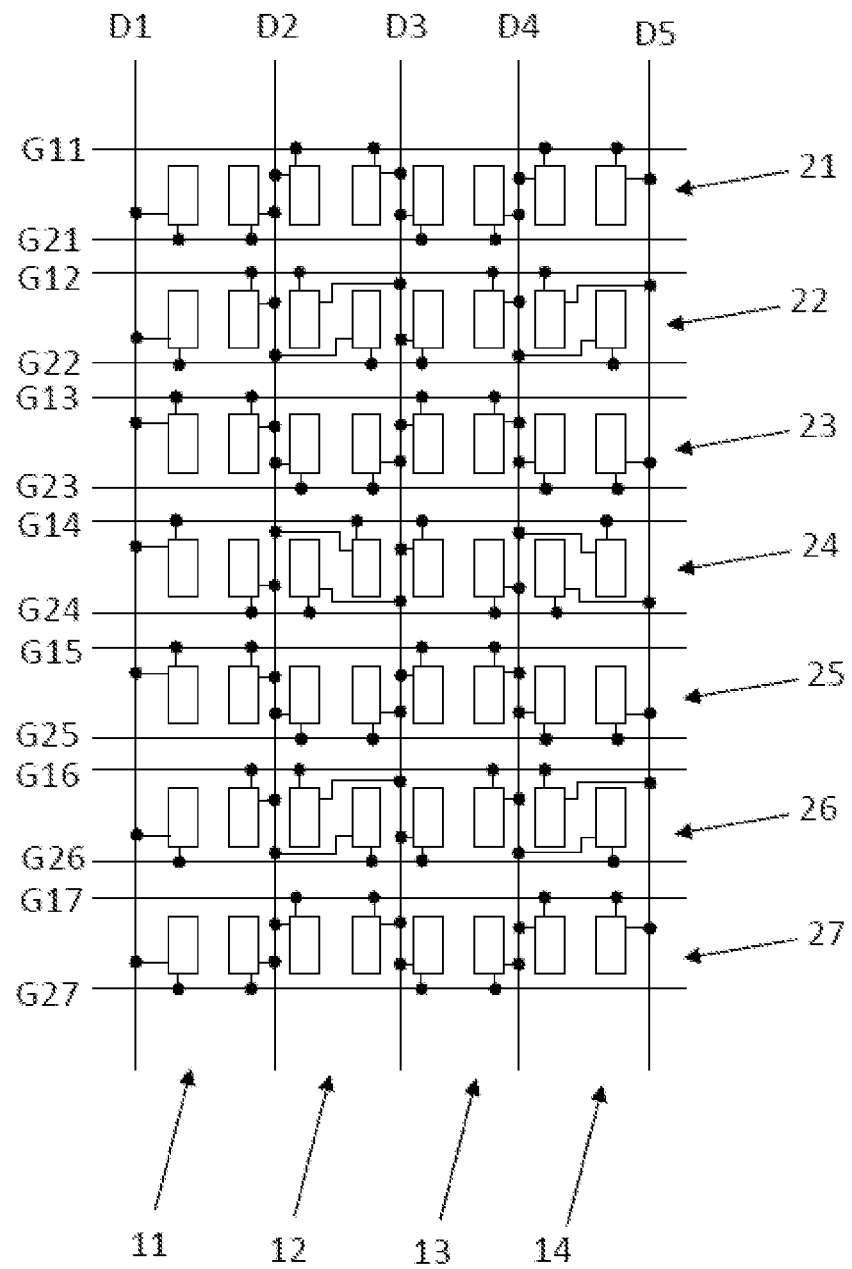
FIG. 3 is a schematic view illustrating a part of a data line share array substrate provided by an embodiment 1 of the present invention.

FIG. 3 is a schematic view illustrating a part of a data line share array substrate provided by an embodiment 1 of the present invention. In the following context, Pxy is used to represent a certain sub-pixel, wherein x=1~7 and y=1~8. As shown in FIG. 3, P11 is the first sub-pixel at the top-left side, and P78 is the last sub-pixel at the bottom right side.

As shown in FIG. 3, in the data lines D1~D5, there are column groups 11, 12, 13, 14 formed between every two adjacent data lines, and each column group includes two columns of sub-pixels (e.g., a first column and a second column of sub-pixels in the column group 11).

In the column groups 11, 13 that numbered with an odd number, each sub-pixel is connected to a closer one of the two data lines disposed at opposite sides of the column group (e.g, in the sub-pixels of the column group 11, a sub-pixel P1y is connected to the data line D1, and a sub-pixel P2y is connected to the data line D2). In the column groups 12, 14 that numbered with an even number, each sub-pixel in a row numbered with an odd number is connected to a closer one of the two data lines disposed at opposite sides of the column group (e.g, in sub-pixels P13 and P14 of a first row of the column group 12, the sub-pixel P13 is connected to the data ine D2, and the sub-pixel P14 is connected to the data line D3). In the column groups 12, 14 that numbered with an even number, each sub-pixel in a row numbered with an even number is connected to a farther one of the two data lines disposed at opposite sides of the column group (e.g, in sub-pixels P23 and P24 of a second row of the column group 12, the sub-pixel P23 is connected to the data ine D3, and the sub-pixel P24 is connected to the data line D2). Here, the closer one or farther one is defined relatively to another one.

For scanning lines G11~G17 and G21~G27, each row of sub-pixels having two corresponding scanning lines disposed at top and bottom of the corresponding row, respectively. The two scanning lines are only used to drive the same row of sub-pixels (e.g., the two scanning lines at top and bottom of a first row of sub-pixels shown in the figure is the scanning lines G11 and G21, respectively, and the scanning lines G11 and G21 are only used to drive the first row of sub-pixels). Then, the sub-pixel array is divided into row groups 21, 22, 23, 24, 25, 26 and 27. In the present embodiment, each row group includes one row of sub-pixels. That is, the row group 21 includes one row of sub-pixels; the row group 22 includes one row of sub-pixels, and so on.

The sub-pixels and the scanning lines are connected in the following manners.

For sub-pixels in the row groups 21, 27 and in the column groups numbered with even numbers 12, 14, each sub-pixel is connected to a corresponding scanning line disposed on a top of a corresponding row (e.g., sub-pixels P13, P14, in the row group 21 and the column group 12 are both connected to the scanning line G11, sub-pixels P73, P74 in the row group 27 and the column group 12 are both connected to the gate line G17). For sub-pixels in the row groups 21, 27 and in the column groups numbered with odd numbers 11, 13, each sub-pixel is connected to a corresponding scanning line disposed on a bottom of a corresponding row (e.g., sub-pixels P11, P12, in the row group 21 and the column group 11 are both connected to the scanning line G21, sub-pixels P71, P72 in the row group 27 and the column group 11 are both connected to the gate line G27).

For sub-pixels numbered with i and i+1 in each row of the row groups 22 and 26, each sub-pixel is connected to a corresponding scanning line disposed on a top of a corresponding row (e.g., a second sub-pixel P22 and a third sub-pixel P23 in the row group 22 are connected to the scanning line G12, a second sub-pixel P62 and a third sub-pixel P63 in the row group 26 are connected to the scanning line G16). For sub-pixels numbered with j and j+3 in each row of the row groups 22 and 26, each sub-pixel is connected to a corresponding scanning line disposed on a bottom of a corresponding row (e.g., a first sub-pixel P21 and a fourth sub-pixel P24 in the row group 22 are connected to the scanning line G22, a first sub-pixel P62 and a fourth sub-pixel P64 in the row group 26 are connected to the scanning line G26). i=2, 6; j=1, 5.

For sub-pixels in the row groups 23, 25 and in the column groups numbered with odd numbers 11, 13, each sub-pixel is connected to a corresponding scanning line disposed on a top of a corresponding row (e.g., sub-pixels P31, P32, in the row group 23 and the column group 11 are both connected to the scanning line G13, sub-pixels P51, P52 in the row group 25 and the column group 11 are both connected to the gate line 15). For sub-pixels in the row groups 23, 25 and in the column groups numbered with even numbers 12, 14, each sub-pixel is connected to a corresponding scanning line disposed on a bottom of a corresponding row (e.g., sub-pixels P33, P34, in the row group 23 and the column group 12 are both connected to the scanning line G23, sub-pixels P33, P34n the row group 25 and the column group 12 are both connected to the gate line G25).

For sub-pixels numbered with j and j+3 in each row of the row group 24, each sub-pixel is connected to a corresponding scanning line disposed on a top of a corresponding row (e.g., a first sub-pixel P41 and a fourth sub-pixel P44 in the row group 24 are connected to the scanning line G14). For sub-pixels numbered with i and i+1 in each row of the row group 24, each sub-pixel is connected to a corresponding scanning line disposed on a bottom of a corresponding row (e.g., a second sub-pixel P42 and a third sub-pixel P43 in the row group 24 are connected to the scanning line G24). i=2, 6; j=1, 5.

Figure 4:
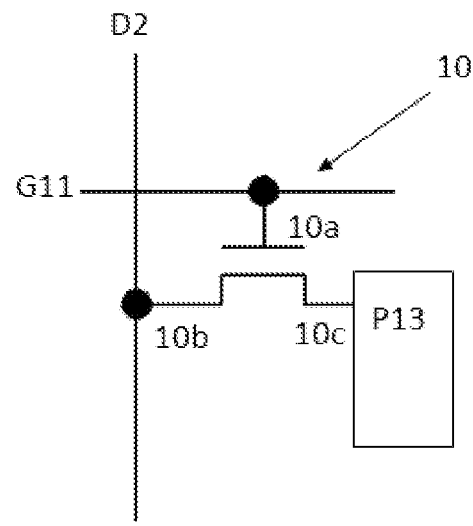
FIG. 4 is a schematic view illustrating a connection structure that the data lines and scanning lines of sub-pixels are connected using thin film transistors in accordance with an embodiment of the present invention.

Each sub-pixel Pxy is connected to the corresponding data line and scanning lines using a switching element. In detail, as shown in FIG. 4, taking the sub-pixel P13 as an example, the switching element in the present embodiment is a thin film transistor (TFT). A gate electrode 10a of the TFT is electrically connected to a corresponding scanning line G11, a source electrode 10b of the TFT is electrically connected to a corresponding data line D2, and a drain electrode 10c of the TFT is electrically connected to the sub-pixel P13.

If a dot inversion driving manner is used, the charging process is described taking the sub-pixels P12, P13 P22, P23, P32, P33, P42, P43, P52, P53, P62, P63, P72, P73 disposed at two sides of the data line D2 as a example. Referring to FIG. 3, when the scanning line G11, G21, . . . G17, and G27 are switched on sequentially, the sub-pixels P12, P13, P22, P32, P33, P42, P52, P53, P62, P72 and P73 are charged by the data line D2, the sub-pixels P23, P43 and P63 are charged by the data line D3. In the sub-pixels of the column Px2, the sub-pixels P12, P42 and P72 are sub-pixels that are sufficiently charged, the sub-pixels P22, P32, P52 and P62 are sub-pixels that are insufficiently charged. In the sub-pixels of the column Px3, the sub-pixels P33, P43, and P53 are sub-pixels that are sufficiently charged, the sub-pixels P13, P23, P63 and P73 are sub-pixels that are insufficiently charged sub-pixels.

Figure 5:
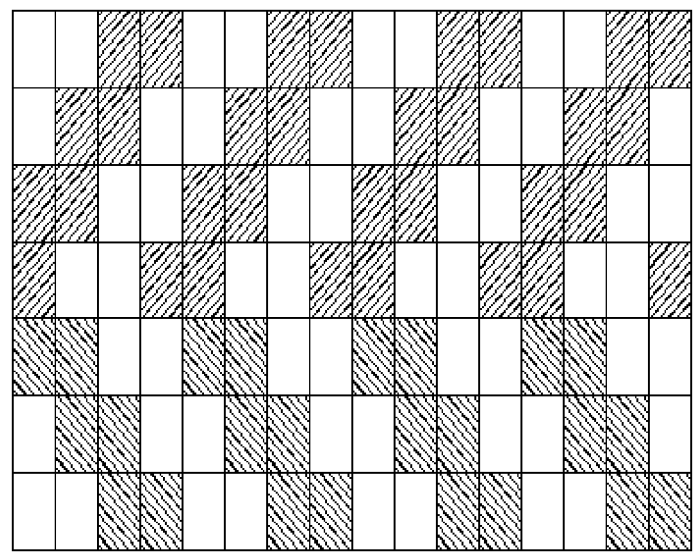
FIG. 5 is a schematic view of the array substrate provided in the embodiment 1 after charging.

FIG. 5 shows the distribution of sufficiently charged sub-pixels and insufficiently charged sub-pixels in a frame period of the above array substrate. In the figure, the white portions represent sufficiently charged sub-pixels, and the shadow portions represent insufficiently charged sub-pixels. As shown in the figure, in sub-pixels of a same column, sufficiently charged sub-pixels and insufficiently charged sub-pixels are alternately distributed, and in sub-pixels of a same row, there are also alternately distributed sufficiently charged sub-pixels and insufficiently charged sub-pixels. Therefore, a LCD panel including the array substrate has even brightness uniformity, and the defect of vertical bright-dark lines is alleviated.

The array substrate of the present embodiment can be obtained by repeating the partial structure shown in the FIG. 3 in the horizontal and vertical directions.

Embodiment 2

Figure 6:
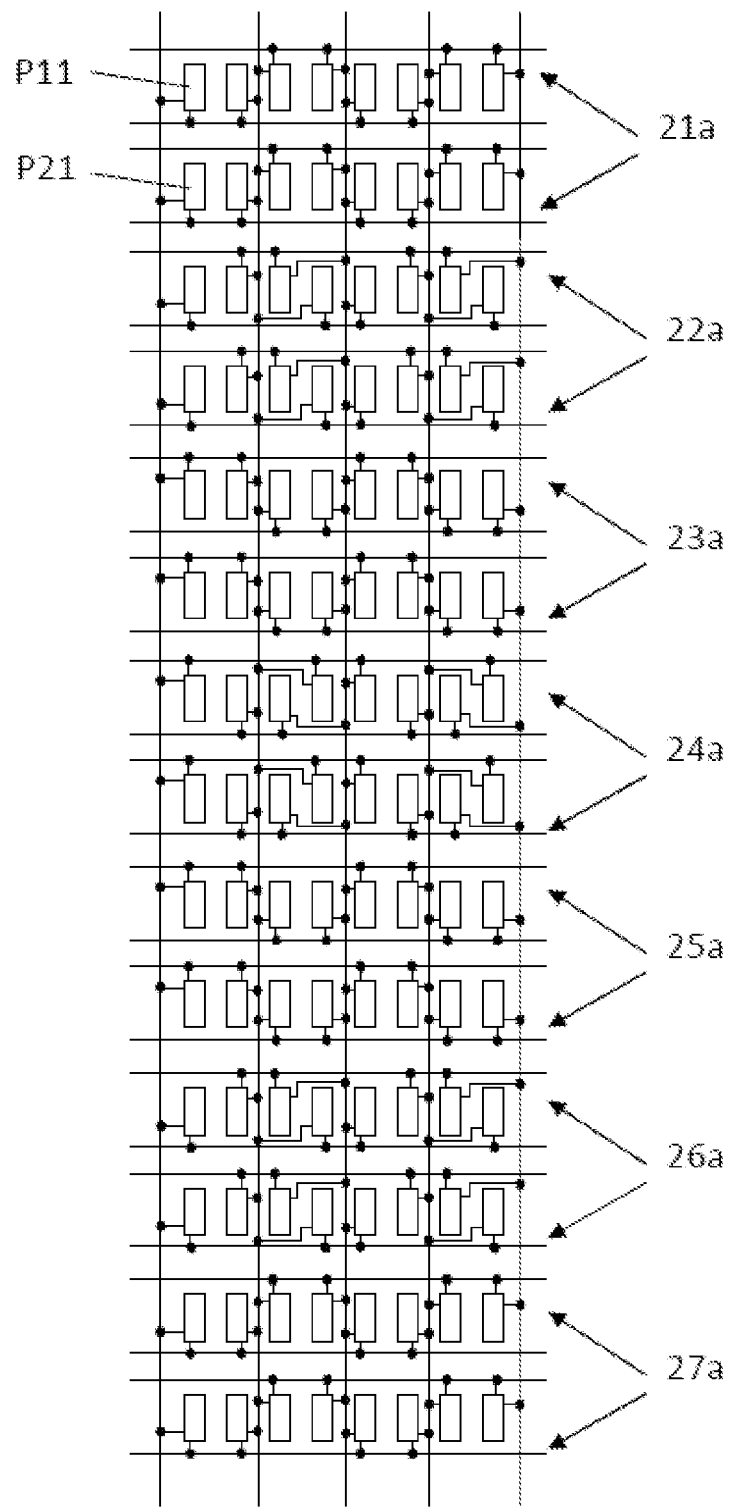
FIG. 6 a schematic view illustrating a part of a data line share array substrate provided by an embodiment 2 of the present invention.

FIG. 6 a schematic view illustrating a part of a data line share array substrate provided by the present embodiment. Differing from the embodiment 1, in the present embodiment, the sub-pixels array is divided into row groups 21a, 22a, 23a, 24a, 25a, 26a and 27a along a distribution direction of the scanning lines. Each row group includes two rows of sub-pixels. As shown in FIG. 6, the row group 21a includes the 1st row and the 2nd row of sub-pixels, the row group 22a includes the 3rd row and the 4th row of sub-pixels, the row group 23a includes the 5th row and the 6th row of sub-pixels, the row group 24a includes the 7th row and the 8th row of sub-pixels, the row group 25a includes the 9th row and the 10th row of sub-pixels, the row group 23a includes the 11th row and the 12th row of sub-pixels, and the row group 27a includes the 13th row and the 14th row of sub-pixels.

The connection of one row of sub-pixels in the row group to the data lines and scanning lines is completely same to that of another row of sub-pixels. That is, the two rows of sub-pixels are used as repeating units. For example, in all the sub-pixels in the 1st row and the 2nd row in the row group 21a, the two vertically adjacent sub-pixels (e.g., the sub-pixels P11 and P21) have the same connection manner. All the sub-pixels in the 1st row and the 2nd row are connected to the data lines and scanning lines in a manner same to the row group 21 of embodiment 1. Similarly, the row group 22a corresponds to the row group 21 of embodiment 1, the row group 23a corresponds to the row group 23 of embodiment 1, the row group 24a corresponds to the row group 24 of embodiment 1, the row group 25a corresponds to the row group 25 of embodiment 1, the row group 26a corresponds to the row group 26 of embodiment 1, and the row group 27a corresponds to the row group 27 of embodiment 1.

Figure 7:
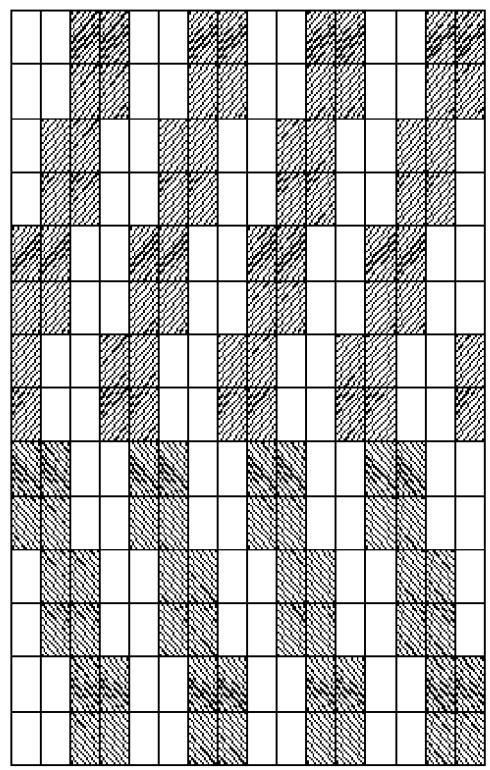
FIG. 7 is a schematic view of the array substrate provided in the embodiment 2 after charging.

FIG. 7 shows the distribution of sufficiently charged sub-pixels and insufficiently charged sub-pixels in a frame period of the above array substrate. In the figure, the white portions represent sufficiently charged sub-pixels, and the shadow portions represent insufficiently charged sub-pixels.

The array substrate of the present embodiment can be obtained by repeating the partial structure shown in the FIG. 6 in the horizontal and vertical directions many times.

Embodiment 3

Figure 8:
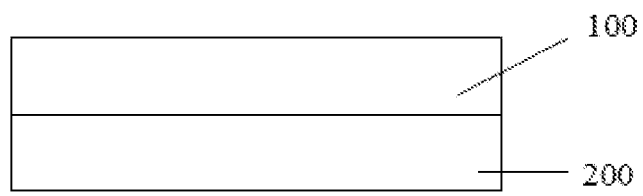
FIG. 8 is a schematic view of a liquid crystal display provided by an embodiment 3 of the present invention.
Figure 9:
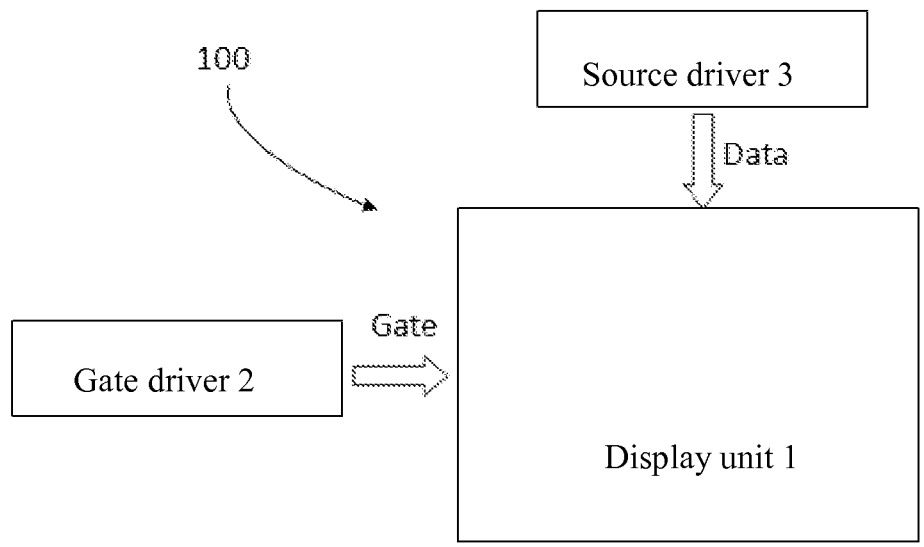
FIG. 9 is a schematic view of a liquid crystal display panel provided by the embodiment 3 of the present invention.

Referring to FIGS. 8 and 9, the present embodiment provides a LCD panel and a LCD including the LCD panel. As shown in FIG. 8, the LCD includes a LCD panel 100 and a backlight module 200. The LCD panel 100 and the backlight module 200 are opposite to each other. The backlight module 200 provides light source to the LCD panel 100 for displaying images.

As shown in FIG. 9, the LCD panel 100 includes a display unit 1 having a sub-pixel array, a gate driver 2 and a source driver 3. The gate driver 2 provides scanning signals Gate to the sub-pixel array via the scanning lines, and the source driver 3 provides data signals Data to the sub-pixels array via the data lines.

Figure 10:
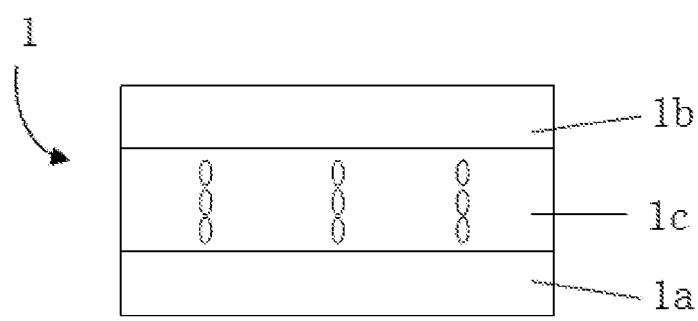
FIG. 10 is a schematic view of a display unit provided by the embodiment 3 of the present invention.

FIG. 10 is a schematic view of the display unit 1. The display unit 1 includes an array substrate 1a, a color filter substrate 1b disposed opposite to the array substrate 1a, and a liquid crystal layer 1c interposed between the array substrate 1a and the color filter substrate. The array substrate 1a can be an array substrate provided by the embodiment 1 and embodiment 2. The sub-pixel Pxy includes a red sub-pixel, a green sub-pixel and a blue sub-pixel.

In summary, the array substrate provided by embodiments has an improved layout design. By designing the layout of the sub-pixels, the data lines and the scanning lines in the array substrate, there are alternately distributed sufficiently charged sub-pixels and insufficiently charged sub-pixels exist in a same column of sub-pixels when a dot inversion driving is used (here, the sufficiently charged sub-pixels and insufficiently charged sub-pixels are defined relatively). Therefore, a LCD panel including the array substrate has even brightness uniformity, and the defect of vertical bright-dark lines is alleviated.

The above description is only detail embodiments of the present application. It is to be noted that those ordinarily skilled in the art would make improvements and modifications to these embodiments without departing from the principle of the present application, and these improvements and modifications should also be included in the scope of the present application.

What is claimed is:

1. An array substrate, comprising:
    a sub-pixel array;
    a plurality of data lines, a column group being formed between every two adjacent data lines, each column group comprising two columns of sub-pixels; sub-pixels in column groups numbered with odd numbers being connected to a closer one of the two adjacent data lines disposed at opposite sides of a corresponding column group; sub-pixels in column groups numbered with even numbers and in rows numbered with odd numbers being connected to a closer one of the two adjacent data lines; sub-pixels in column groups numbered with even numbers and in rows numbered with even numbers being connected to a farther one of the two adjacent data lines;
    a plurality of scanning lines, two scanning lines being disposed at top and bottom of each row of sub-pixels and the two scanning lines being configured only for driving a same corresponding row of sub-pixels; the plurality of scanning lines dividing the sub-pixel array into a plurality of row groups, each row group comprising one or two rows of sub-pixels;
    in the row groups numbered n and n+6, each row of sub-pixels in a column group numbered with an even number being connected to a scanning line disposed on a top of a corresponding row of sub-pixels, each row of sub-pixels in a column group numbered with an odd number being connected to a scanning line disposed on a bottom of a corresponding row of sub-pixels;
    in the row groups numbered n+1 and n+5, each sub-pixel numbered with i and i+1 in each row of the row groups being connected to a scanning line disposed on a top of a corresponding row of sub-pixels, and each sub-pixel numbered with j and j+3 in each row of the row groups being connected to a scanning line disposed on a bottom of a corresponding row of sub-pixels;
    in the row groups numbered n+2 and n+4, each row of sub-pixels in a column group numbered with an odd number being connected to a scanning line disposed on a top of a corresponding row of sub-pixels, each row of sub-pixels in a column group numbered with an even number being connected to a scanning line disposed on a bottom of a corresponding row of sub-pixels;
    in the row groups numbered n+3, each sub-pixel numbered with j and j+3 in each row of the row groups being connected to a scanning line disposed on a top of a corresponding row of sub-pixels, and each sub-pixel numbered with i and i+1 in each row of the row groups being connected to a scanning line disposed on a bottom of a corresponding row of sub-pixels;
    wherein n=1, 5, 9, . . . n−4, n; i=2, 6, 10, . . . i−4, i; j=1, 5, 9, . . . j−4, j.

2. The array substrate of claim 1, wherein each sub-pixel is connected to a corresponding data line and a corresponding scanning line via a switching element.

3. The array substrate of claim 1, wherein the switching element is a thin film transistor, a gate electrode of the thin film transistor is electrically connected to the corresponding scanning line, a source electrode of the thin film transistor is electrically connected to the corresponding data line, and a drain electrode of the thin film transistor is electrically connected to the sub-pixel.

4. A liquid crystal display panel, comprising a display unit, the display unit comprising an array substrate, a color filter substrate disposed opposite to the array substrate, and a liquid layer interposed between the array substrate and the color filter substrate, the array substrate comprising:
    a sub-pixel array;
    a plurality of data lines, a column group being formed between every two adjacent data lines, each column group comprising two columns of sub-pixels; sub-pixels in column groups numbered with odd numbers being connected to a closer one of the two adjacent data lines disposed at opposite sides of a corresponding column group; sub-pixels in column groups numbered with even numbers and in rows numbered with odd numbers being connected to a closer one of the two adjacent data lines; sub-pixels in column groups numbered with even numbers and in rows numbered with even numbers being connected to a farther one of the two adjacent data lines;
    a plurality of scanning lines, two scanning lines being disposed at top and bottom of each row of sub-pixels and the two scanning lines being configured only for driving a same corresponding row of sub-pixels; the plurality of scanning lines dividing the sub-pixel array into a plurality of row groups, each row group comprising one or two rows of sub-pixels;
    in the row groups numbered n and n+6, each row of sub-pixels in a column group numbered with an even number being connected to a scanning line disposed on a top of a corresponding row of sub-pixels, each row of sub-pixels in a column group numbered with an odd number being connected to a scanning line disposed on a bottom of a corresponding row of sub-pixels;
    in the row groups numbered n+1 and n+5, each sub-pixel numbered with i and i+1 in each row of the row groups being connected to a scanning line disposed on a top of a corresponding row of sub-pixels, and each sub-pixel numbered with j and j+3 in each row of the row groups being connected to a scanning line disposed on a bottom of a corresponding row of sub-pixels;

in the row groups numbered n+2 and n+4, each row of sub-pixels in a column group numbered with an odd number being connected to a scanning line disposed on a top of a corresponding row of sub-pixels, each row of sub-pixels in a column group numbered with an even number being connected to a scanning line disposed on a bottom of a corresponding row of sub-pixels;

in the row groups numbered n+3, each sub-pixel numbered with j and j+3 in each row of the row groups being connected to a scanning line disposed on a top of a corresponding row of sub-pixels, and each sub-pixel numbered with i and i+1 in each row of the row groups being connected to a scanning line disposed on a bottom of a corresponding row of sub-pixels;

wherein n =1, 5, 9, . . . n−4, n; i=2, 6, 10, . . . i−4, i; j=1, 5, 9, . . . j−4, J.

5. The liquid crystal display panel of claim 4, wherein each sub-pixel is connected to a corresponding data line and a corresponding scanning line via a switching element.

6. The liquid crystal display panel of claim 5, wherein the switching element is a thin film transistor, a gate electrode of the thin film transistor is electrically connected to the corresponding scanning line, a source electrode of the thin film transistor is electrically connected to the corresponding data line, and a drain electrode of the thin film transistor is electrically connected to the sub-pixel.

7. The liquid crystal display panel of claim 4, wherein the liquid crystal display panel further comprises a gate driver and a source driver, the gate driver provides scanning signals to the sub-pixel array via the scanning lines, and the source driver provides data signals to the sub-pixel array via the data lines.

8. The liquid crystal display panel of claim 4, wherein the sub-pixels comprise red sub-pixels, green sub-pixels and blue sub-pixels.

9. The liquid crystal display panel of claim 4, wherein the liquid crystal display panel is driven using a dot inversion manner.

10. A liquid crystal display, comprising a liquid crystal display panel and a backlight module, the liquid crystal display panel and the backlight module being disposed opposite to each other, the backlight module providing light source to the liquid crystal display panel for enabling the liquid crystal display panel to display images, the liquid crystal display panel comprising a display unit, the display unit comprising an array substrate, a color filter substrate disposed opposite to the array substrate, and a liquid layer interposed between the array substrate and the color filter substrate, the array substrate comprising:

a sub-pixel array;

a plurality of data lines, a column group being formed between every two adjacent data lines, each column group comprising two columns of sub-pixels; sub-pixels in column groups numbered with odd numbers being connected to a closer one of the two adjacent data lines disposed at opposite sides of a corresponding column group; sub-pixels in column groups numbered with even numbers and in rows numbered with odd numbers being connected to a closer one of the two adjacent data lines; sub-pixels in column groups numbered with even numbers and in rows numbered with even numbers being connected to a farther one of the two adjacent data lines;

a plurality of scanning lines, two scanning lines being disposed at top and bottom of each row of sub-pixels and the two scanning lines being configured only for driving a same corresponding row of sub-pixels; the plurality of scanning lines dividing the sub-pixel array into a plurality of row groups, each row group comprising one or two rows of sub-pixels;

in the row groups numbered n and n+6, each row of sub-pixels in a column group numbered with an even number being connected to a scanning line disposed on a top of a corresponding row of sub-pixels, each row of sub-pixels in a column group numbered with an odd number being connected to a scanning line disposed on a bottom of a corresponding row of sub-pixels;

in the row groups numbered n+1 and n+5, each sub-pixel numbered with i and i+1 in each row of the row groups being connected to a scanning line disposed on a top of a corresponding row of sub-pixels, and each sub-pixel numbered with j and j+3 in each row of the row groups being connected to a scanning line disposed on a bottom of a corresponding row of sub-pixels;

in the row groups numbered n+2 and n+4, each row of sub-pixels in a column group numbered with an odd number being connected to a scanning line disposed on a top of a corresponding row of sub-pixels, each row of sub-pixels in a column group numbered with an even number being connected to a scanning line disposed on a bottom of a corresponding row of sub-pixels;

in the row groups numbered n+3, each sub-pixel numbered with j and j+3 in each row of the row groups being connected to a scanning line disposed on a top of a corresponding row of sub-pixels, and each sub-pixel numbered with i and i+1 in each row of the row groups being connected to a scanning line disposed on a bottom of a corresponding row of sub-pixels;

wherein n=1, 5, 9, . . . n−4, n; i=2, 6, 10, . . . i−4, i; j=1, 5, 9, . . . j−4, J.

11. The liquid crystal display of claim 10, wherein each sub-pixel is connected to a corresponding data line and a corresponding scanning line via a switching element.

12. The liquid crystal display of claim 11, wherein the switching element is a thin film transistor, a gate electrode of the thin film transistor is electrically connected to the corresponding scanning line, a source electrode of the thin film transistor is electrically connected to the corresponding data line, and a drain electrode of the thin film transistor is electrically connected to the sub-pixel.

13. The liquid crystal display of claim 10, wherein the liquid crystal display panel further comprises a gate driver and a source driver, the gate driver provides scanning signals to the sub-pixel array via the scanning lines, and the source driver provides data signals to the sub-pixel array via the data lines.

14. The liquid crystal display panel of claim 10, wherein the sub-pixels comprise red sub-pixels, green sub-pixels and blue sub-pixels.

15. The liquid crystal display panel of claim 10, wherein the liquid crystal display panel is driven using a dot inversion manner.

* * * * *